(12) United States Patent
Griesbach et al.

(10) Patent No.: US 8,694,940 B2
(45) Date of Patent: Apr. 8, 2014

(54) SYSTEM AND METHOD FOR INTEGRATED CIRCUIT DESIGN AND IMPLEMENTATION USING MIXED CELL LIBRARIES

(75) Inventors: William R. Griesbach, Pocono Lake, PA (US); Clayton E. Schneider, Jr., Bethlehem, PA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/546,791

(22) Filed: Jul. 11, 2012

(65) Prior Publication Data

US 2014/0019932 A1 Jan. 16, 2014

(51) Int. Cl.
*G06F 17/50* (2006.01)
(52) U.S. Cl.
USPC ............................. 716/119; 716/126; 716/139
(58) Field of Classification Search
USPC .......................................... 716/119, 126, 139
See application file for complete search history.

(56) References Cited

U.S. PATENT DOCUMENTS 6,865,726 B1 * 3/2005 Igusa et al. ..................... 716/105
6,938,226 B2 * 8/2005 Nguyen et al. ................ 716/122

OTHER PUBLICATIONS

Karam, J.M., et al., "CAD and Foundries for Microsystems", ACM 1997, 7 Pages.

* cited by examiner

*Primary Examiner* — Thuan Do

(57) ABSTRACT

A system and method for designing circuits, such as integrated circuits, that allow a designer to employ mixed cell libraries. In one embodiment, the system includes: (1) a cell placement EDA tool configured to transform a logical circuit representation into a physical circuit representation by placing cells from mixed cell libraries into clusters corresponding to the mixed cell libraries and (2) an interconnect routing EDA tool associated with the cell placement EDA tool and configured to route interconnects in buffer zones separating the clusters.

20 Claims, 5 Drawing Sheets

SYSTEM AND METHOD FOR INTEGRATED CIRCUIT DESIGN AND IMPLEMENTATION USING MIXED CELL LIBRARIES

TECHNICAL FIELD

This application is directed, in general, to integrated circuit (IC) design and, more specifically, to a system and method for IC design and implementation.

BACKGROUND

Circuit designers use electronic design automation (EDA) tools, a category of computer-aided design (CAD) tools, for designing and laying out electronic circuits, including formulating the logic that underlies the operation of the circuit, simulating the operation of the circuit, determining where cells (i.e., logic elements including devices, e.g., transistors) should be placed and where the interconnects that couple the cells together should be routed. EDA tools allow designers to construct a circuit and simulate its performance using a computer and without requiring the costly and lengthy process of manual fabrication. EDA tools are indispensable for designing modern ICs, particularly very-large-scale integrated circuits (VLSICs). For this reason, EDA tools are in wide use.

During an initial, "design," stage, circuit designers employ one or more EDA tools to create a logical representation of a desired electronic circuit. After becoming satisfied (typically through simulation) that the logical representation of the circuit operates as intended, the circuit designers then employ EDA tools called "IC compilers" (ICCs) to transform the logical representation (typically embodied in a "netlist") automatically into a corresponding physical representation in an "implementation" stage. The implementation stage typically includes two substages: a "placement" substage in which appropriate cells are selected from a cell library and placed relative to one another in an area representing a substrate which will support the circuit, and a "routing" substage in which the interconnects are routed across the substrate to yield a cohesive electronic circuit.

SUMMARY

One aspect provides a system for circuit design and implementation using mixed cell libraries. In one embodiment, the system includes: (1) a cell placement EDA tool configured to transform a logical circuit representation into a physical circuit representation by placing cells from mixed cell libraries into clusters corresponding to the mixed cell libraries and (2) an interconnect routing EDA tool associated with the cell placement EDA tool and configured to route interconnects in buffer zones separating the clusters.

Another aspect provides a method of circuit design and implementation using mixed cell libraries. In one embodiment, the method includes: (1) transforming a logical circuit representation into a physical circuit representation by placing cells from mixed cell libraries into clusters corresponding to the mixed cell libraries and (2) routing interconnects in buffer zones separating the clusters Yet another aspect provides a computer-readable storage medium containing program instructions for designing and implementing a circuit using mixed cell libraries. In one embodiment, execution of the program instructions by one or more processors of a computer system cause the one or more processors to: (1) transform a logical circuit representation into a physical circuit representation by placing cells from mixed cell libraries into clusters corresponding to the mixed cell libraries and (2) route interconnects and row end-caps in buffer zones separating the clusters.

BRIEF DESCRIPTION

Reference is now made to the following descriptions taken in conjunction with the accompanying drawings, in which.

DETAILED DESCRIPTION

Figure 1:
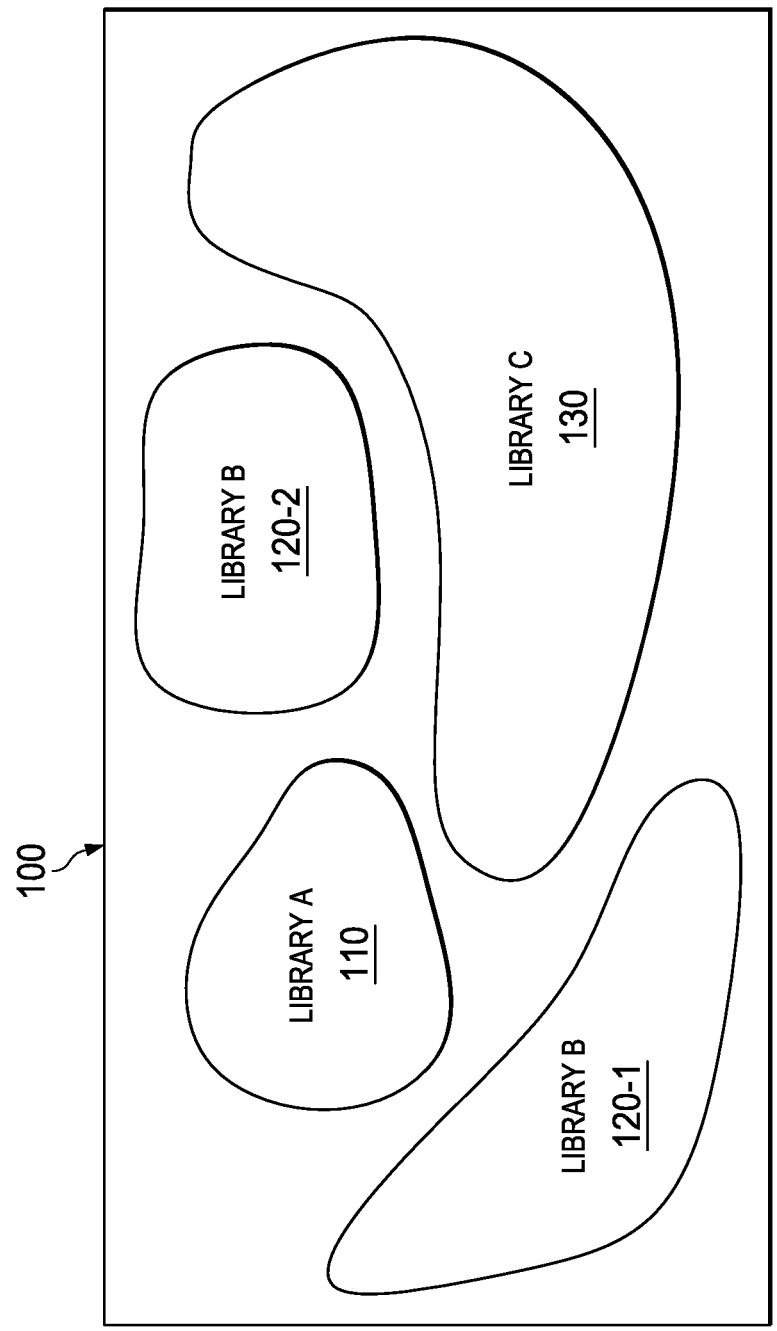
FIG. 1 is a highly schematic representation of a logical representation of a circuit design divided into clusters distinguished from one another in terms of design priority (i.e., standard cell library)

The process of developing a modern electronic circuit, and particularly a modern IC, inevitably involves tradeoffs among often incompatible priorities. While those skilled in the pertinent art are aware of a host of possible priorities, some of the more apparent are manufacturing cost (e.g., yield), circuit size (e.g., die area), fabrication technology, operating speed, power consumption, reliability and amenability to subsequent modification (e.g., for later generations).

Reflecting this fact, different cell libraries reflecting the different priorities are commercially available for designers to employ. Some cell libraries are optimized for operating speed. Others are optimized for circuit size. Still others are optimized for a given fabrication process. Often different cell libraries have different form-factors (reflected as differences in, e.g., cell row height, power rail height or interconnect routing pitch). Sometimes cell libraries are differentiated from one another in ways other than form-factor, e.g., operating voltage or another cell characteristic.

For these reasons, each cell library comes with its own "technology file," which defines how cells taken from the library are to be implemented. One important piece of information contained in a technology file is a "unit tile," which describes how cells may be placed and interconnects routed during the implementation stage. For purposes of the present disclosure, "different cell libraries" contain cells that are in different "families," i.e., different from one another in terms of unit tile or cell or other characteristic such that some layout, interconnect routing, power or signal adaptation is required for the cells in the different cell libraries to function together in a given circuit. "Different cell libraries" are not merely libraries containing cells that perform different functions but are of the same family in terms of their unit tile, cell and other characteristics.

It is realized herein that electronic circuits have the potential to become more sophisticated and capable when designers are liberated from the constraint of implementing a given circuit using a single cell library. Given the ability to use multiple, different cell libraries, designers are free to assign different priorities to different portions of a given circuit design. Circuit designs using "mixed cell libraries" draw cells from multiple, different cell libraries during implementation.

Unfortunately, modern EDA implementation tools, such as the IC Compiler (ICC) commercially available from Synopsys, Inc., of Mountain View, Calif., do not provide a straightforward way to implement circuit designs with mixed cell libraries. While conventional implementation tools allow a designer to define more than one unit tile in a given circuit design, they provide no way to accommodate them in the same hierarchical layer of the design. Neither do conventional tools provide a way for a designer to influence or explicitly define the physical areas in which cells from different cell libraries are allowed to be placed.

The only known way to accommodate mixed standard cell libraries in a given circuit design using conventional tools is to assign different cell libraries to different hierarchical layers. Unfortunately, this frustrates the fundamental theory underlying hierarchical circuit design, namely that functional blocks are described in lower hierarchical layers and treated as "black boxes" in higher hierarchical layers.

It is realized herein that a given circuit design can make use of different cell libraries without resorting to defining additional hierarchical layers by identifying each instance of a cell in a given design with a particular cell library. Introduced herein are various embodiments of a system and method for circuit design and implementation in which the identities of the cell libraries from which the cells of a design are to be drawn become a feature upon which an implementation tool such as ICC can operate. With the benefit of cell library identities as the novel system and method provide, designers can create partitions for different libraries in a given hierarchical layer of a design, and designers can even expressly define physical clusters within which cells drawn from different cell libraries may be placed. In embodiments to be illustrated and described, the identities of the cell libraries are contained in the netlist containing the logical representation of the circuit design, along with other attributes of the logical representation netlists conventionally contain. Those skilled in the art will understand, however, that the identities of the cell libraries may be associated with the logical representation in other ways.

In some embodiments, the system and method are embodied in a design tool configured to perform one or both of the identification and partitioning functions automatically. In other embodiments, the designer can perform at least a part of one or both of these functions manually. With an appropriate technology file available for each cell library present in the design, appropriate technology information can be associated with each partition and cluster during implementation without the need for artificially imposed hierarchical boundaries or a similar workaround, such as a complex, composite technology file describing multiple cell libraries.

In certain embodiments, the system and method impose no restriction on the number of technology files and concomitant standard cell libraries that can be made concurrently available during implementation. In some related embodiments, one technology file is designated as a default or primary technology file, one potential advantage being that the netlist can be shorter. However, in other related embodiments, no technology file is so designated.

In embodiments to be illustrated and described, the system and method are configured to employ the unit tile specified in the netlist for the standard cells to make associations between each cell and the appropriate technology file. Further, these embodiments of the system and method not only recognize the associations during implementation, but also make them available to designers for manual operations, such as hand placement of cells or design partitioning, e.g., creation of hierarchical blocks and placement groups.

Having generally described various embodiments of systems and methods for circuit design and implementation using mixed cell libraries, some particular embodiments will now be illustrated and described.

Circuit design begins with the generation of a logical representation of a circuit in the design stage. Then, the operation of the circuit is typically verified by means of simulation and revised as needed until it works as intended. The designer can make choices of cell libraries to be employed in portions of the circuit at any point in the design stage. In the illustrated embodiment, the choices are reflected in a netlist describing the logical representation, which is ultimately ready for implementation in physical form.

According to the illustrated embodiment, standard cells can be grossly placed with reference to the appropriate standard cell library to be used but ignoring the details of cell rows and unit tiles. FIG. 1 is a highly schematic representation of a physical representation of a circuit design arranged on an example substrate 100. The circuit design is divided into clusters 110, 120-1, 120-2, 130 distinguished from one another in terms of design priority (i.e., standard cell library). As stated above, the cells in the clusters 110, 120-1, 120-2, 130 are grossly placed, and usually tend not to be placed in relatively orderly rows. For this reason, FIG. 1 illustrates the clusters 110, 120-1, 120-2, 130 as irregular shapes.

The cluster 110 corresponds to a first cell library, Library A. The clusters 120-1, 120-2 both individually correspond to a second cell library, Library B. The cluster 130 corresponds to a third cell library, Library C. FIG. 1 is presented primarily for the purpose of illustrating that a designer may partition the logical representation of circuit design into separate clusters having different design priorities associated with each of the clusters. For example, the cluster 110 (and the corresponding Library A) may have a speed design priority; the clusters 120-1, 120-2 (and the corresponding Library B) may have a size design priority; and the cluster 130 (and the corresponding Library C) may have a power consumption design priority. Design priorities such as these may exist in, for example, a system-on-a-chip (SoC) IC design in which the cluster 110 is a processor, the clusters 120-1, 120-2 are combinatorial logic and the cluster 130 is memory. It is cognizable that a suitable processor design priority might be speed; a suitable combinatorial logic design priority might be size (i.e., die area); and a suitable memory design priority might be power consumption. Those skilled in the pertinent art will understand that the circuit may take many other forms and have many different numbers of clusters and associated cell libraries.

Figure 2:
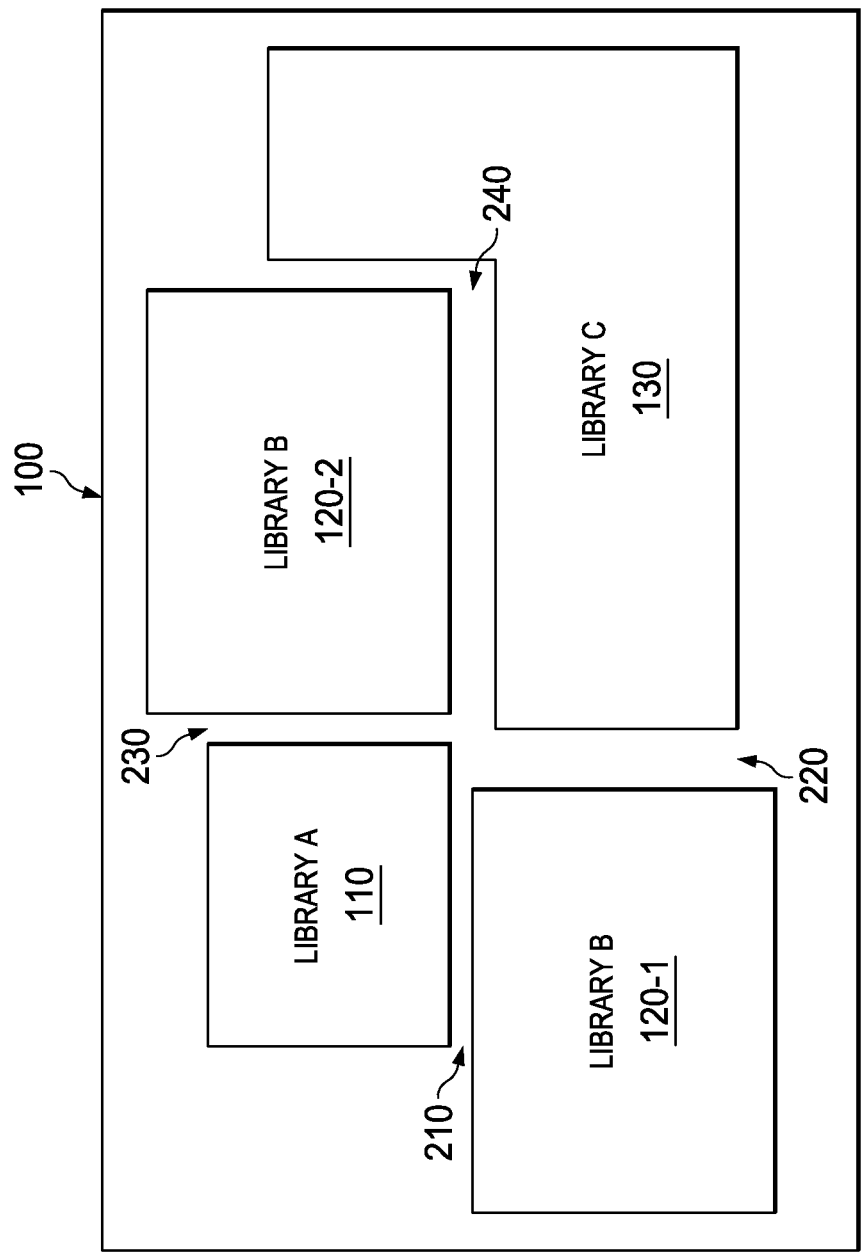
FIG. 2 is a schematic representation of a substrate on which is implemented a physical representation of circuit design corresponding to the logical representation of FIG. 1 and having mixed libraries.

Once clusters are established as FIG. 1 shows, appropriate cell rows can be formed in those areas based on the unit tile of the cells in the cluster. FIG. 2 is a schematic representation of a substrate on which cells of a physical representation of the circuit design of FIG. 1 are coarsely placed and clustered according to cell library. Accordingly, FIG. 2 shows the substrate 100 on which the clusters 110, 120-1, 120-2, 130 are placed in relatively orderly rows (not illustrated, but schematically represented in the generally rectangular shape of the clusters 110, 120-1, 120-2, 130).

FIG. 2 shows a plurality of buffer zones 210, 220, 230, 240 that exist among the clusters 110, 120-1, 120-2, 130. In the illustrated embodiment, the buffer zones 210, 220, 230, 240 are of differing width. In an alternative embodiment, at least two of the buffer zones 210, 220, 230, 240 are of the same width. Where, for example, routing pitches differ among unit tiles in different clusters of a given circuit design, the illustrated embodiment of the system and method are configured to create buffer zones in transitions from one unit tile area to another. The buffer zones 210, 220, 230, 240 are provided to accommodate adaptation among the clusters 110, 120-1, 120-2, 130, namely some additional room for interconnect routing and, in some embodiments, row end-cap cells or other boundary terminations that may be appropriate for a given cluster 110, 120-1, 120-2, 130 in a given design. As those skilled in the pertinent art understand, end-cap cells are commonly placed at the end of cell rows and to ensure gaps do not occur between well or implant layers which could cause design rule violations. Sometimes end-cap cells are used to connect power and ground rails across an area.

In the illustrated embodiment, an IC designer specifies boundary zone width and placement. In an alternative embodiment, the buffer zones are calculated automatically, for example, by referring to the technology files associated with the clusters that they bound.

FIGS. 1 and 2 give the impression that the system and method necessarily retain the number of clusters throughout the placement process. However, this need not be the case. Some embodiments of the system and method are configured to change the number of clusters associated with given cell libraries. Some of those embodiments are configured to change the number of clusters to improve the overall size or performance of the resulting circuit. Still other of those embodiments are configured to change the number of clusters to optimize the overall size or performance of the resulting circuit. The embodiments now to be described in conjunction with FIGS. 3 and 4 introduce the concept of cluster "granularity."

Figure 3:
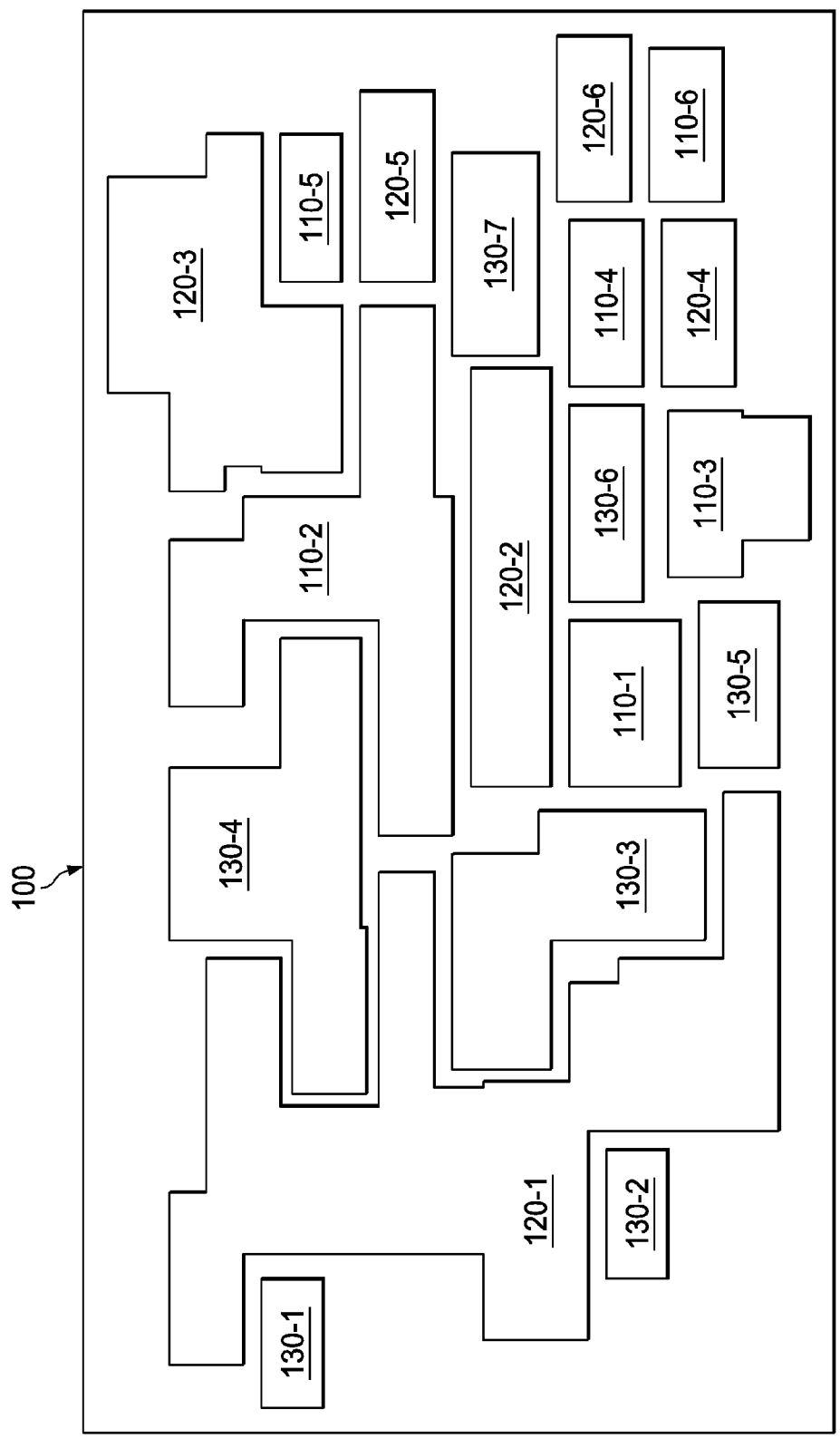
FIG. 3 is a schematic representation of a substrate on which is implemented a physical representation of circuit design resulting when a relatively fine-grain cluster sizing is specified.
Figure 4:
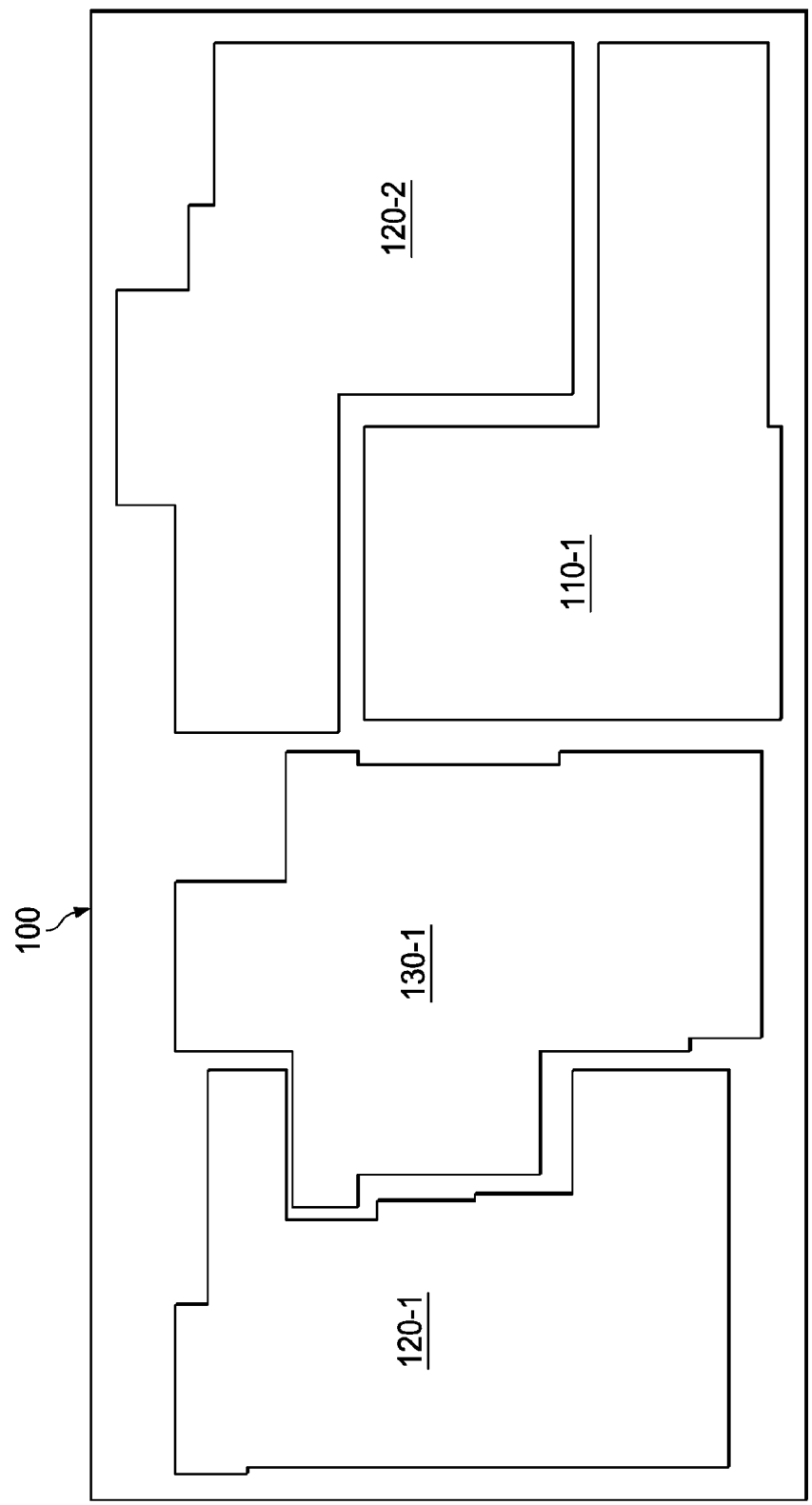
FIG. 4 is a schematic representation of a substrate on which is implemented a physical representation of circuit design resulting when a relatively coarse-grain cluster sizing is specified.

FIG. 3 is a schematic representation of a substrate on which is implemented a physical representation of circuit design resulting when a relatively fine-grain cluster sizing is specified, whereas FIG. 4 is a schematic representation of a substrate on which is implemented a physical representation of circuit design resulting when a relatively coarse-grain cluster sizing is specified. FIG. 3 shows a physical implementation having a relatively large plurality of clusters 110-1 through 110-6 associated with Library A, a relatively large plurality of clusters 120-1 through 120-6 associated with Library B and a relatively large plurality of clusters 130-1 through 130-7 associated with Library C. This is contrasted with FIG. 4, which illustrates a physical configuration having a relatively coarse granularity, resulting in only the cluster 110 being associated with Library A, the clusters 120-1, 120-2 being associated with Library B and the cluster 130 being associated with Library C. The fine-grain cluster sizing of FIG. 3 may result in greater circuit performance, but at the cost of more buffer zones devoted to inter-cluster interconnect routing. The coarse-grain cluster sizing of FIG. 4 appears to reduce the area devoted to buffer zones, but may come at the cost of circuit performance.

Figure 5:
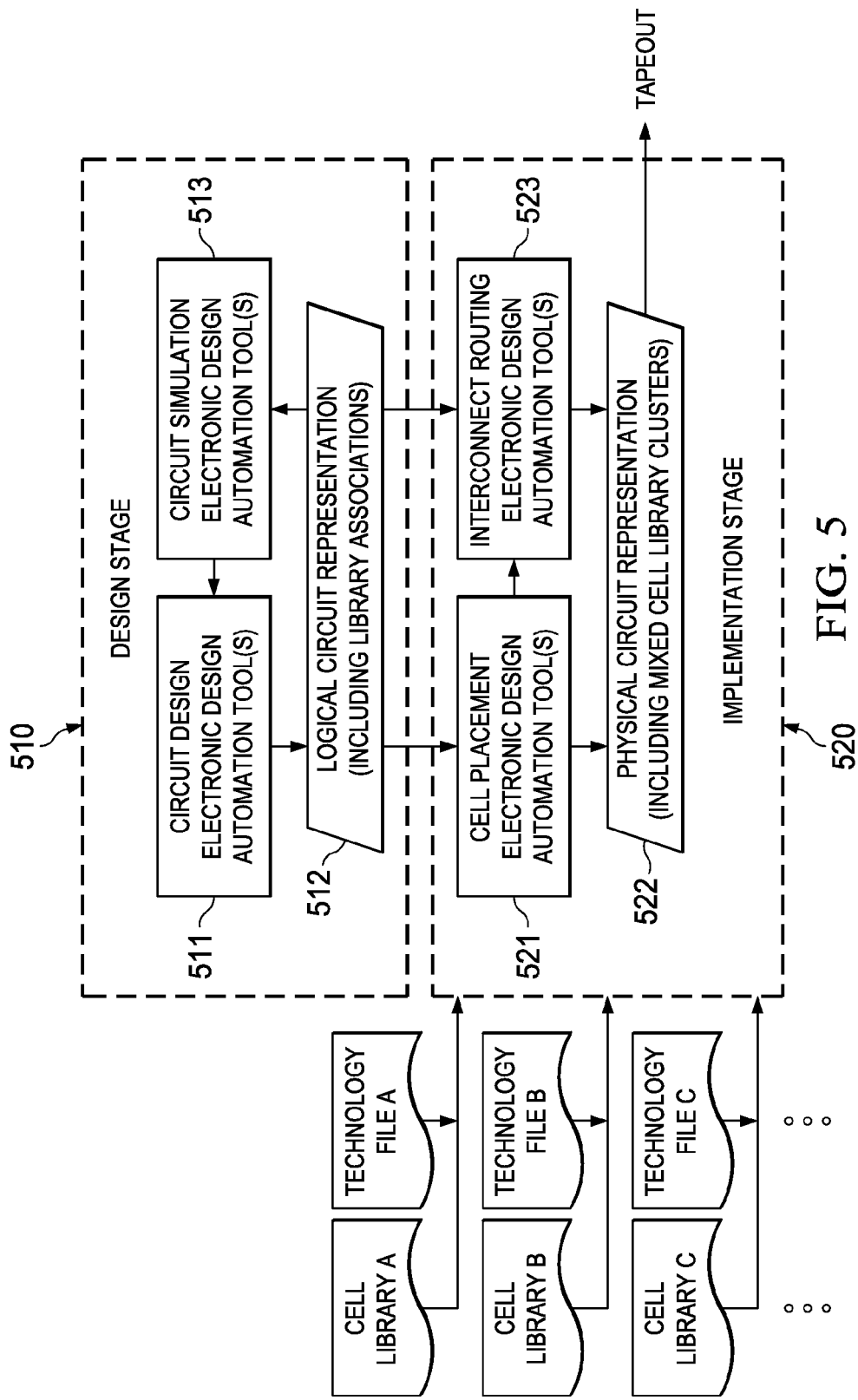
FIG. 5 is a hybrid block and flow diagram of one embodiment of a system and method for circuit design and implementation using mixed cell libraries.

FIG. 5 is a hybrid block and flow diagram of one embodiment of a system and method for circuit design and implementation using mixed cell libraries. FIG. 5 shows two stages (perhaps among others) in a circuit creation process: a design stage 510 and an implementation stage 520.

In the design stage 510, one or more designers employ one or more circuit design EDA tools 511 to create a logical circuit representation 512. As stated above, the logical circuit representation 512 includes one or more associations between portions of the circuit and cell libraries that may or are eventually to be used as sources for cells in the portions as the portions are being laid out during the implementation stage 520. In the illustrated embodiment, a netlist expresses the logical circuit representation 512, which then contains identities of libraries for at least some of the portions reflected in the netlist.

The one or more designers then typically subject the logical circuit representation 512 to one or more simulations using one or more circuit simulation EDA tools 513. The results of the one or more simulations may prompt the one or more designers to modify the logical circuit representation until it operates as intended. Arrowheaded lines extending among the one or more circuit design EDA tools 511, the logical circuit representation 512 and the one or more circuit simulation tools 513 are intended schematically to represent the iterative nature of the process occurring within the design stage 510.

In the implementation stage 520, one or more cell placement EDA tools 521 are employed to transform the logical circuit representation 512 into a physical circuit representation 522 by placing cells from mixed cell libraries into clusters corresponding to the mixed cell libraries. Accordingly, the one or more cell placement EDA tools 521 are configured to draw cells from the mixed cell libraries based on the contents of the logical circuit representation 512. Accordingly, FIG. 5 shows three cell libraries: Cell Library A, Cell Library B and Cell Library C. Each of the three cell libraries has an associated technology file: Cell Library A has an associated Technology File A; Cell Library B has an associated Technology File B; and Cell Library C has an associated Technology File C. The one or more cell placement EDA tools 521 employ the appropriate technology file to lay out cells drawn from its associated cell library, resulting in the cells being properly laid out, e.g., with respect to cell row height, power rail height or interconnect routing pitch.

The one or more cell placement EDA tools 521 lay out the cells drawn from the mixed cell libraries (i.e., the Cell Library A, the Cell Library B and the Cell Library C) to create a physical circuit representation 522. Because mixed cell libraries are employed to create the physical circuit representation 522, the physical circuit representation 522 has multiple clusters. Each of the clusters contains cells from one of the cell libraries. Buffer zones lie between the clusters, providing additional room that may be required for interconnections between clusters of different unit tile or other property.

Further in the implementation stage 520, one or more interconnect routing EDA tools 523, associated with the one or more cell placement EDA tools, are configured to route interconnects in the buffer zones separating the clusters. The one or more interconnect routing tools may also place row end-caps or other structures in the buffer zones. In an alternative embodiment, the one or more cell placement EDA tools 521 are configured to place the row end-caps in the buffer zones, and the one or more interconnect routing EDA tools 523 merely route the interconnects in and among the clusters. Arrowheaded lines extending among the one or more cell placement EDA tools 521, the physical circuit representation 522 and the one or more interconnect routing tools 513 are intended schematically to represent the general flow of the process occurring within the implementation stage 520.

When the physical circuit representation 522 is complete, further simulations may take place to confirm its proper operation. Eventually, the physical circuit representation 522 is employed to generate data to control circuit fabrication equipment, whereupon a milestone called "tapeout" is reached, as FIG. 5 shows.

As described above, yet another aspect of the invention provides a computer-readable storage medium containing program instructions for designing and implementing a circuit using mixed cell libraries. In one embodiment, execution of the program instructions by one or more processors of a computer system cause the one or more processors to: (1) transform a logical circuit representation into a physical circuit representation by placing cells from mixed cell libraries into clusters corresponding to the mixed cell libraries and (2) route interconnects and row end-caps in buffer zones separating the clusters. The program instructions may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps or functions of the hybrid block and flow diagram of FIG. 5.

Those skilled in the art to which this application relates will appreciate that other and further additions, deletions, substitutions and modifications may be made to the described embodiments.

What is claimed is:

1. A system for circuit design and implementation using mixed cell libraries, comprising:
    a cell placement EDA tool configured to transform a logical circuit representation into a physical circuit representation by placing cells from mixed cell libraries into clusters corresponding to said mixed cell libraries; and
    an interconnect routing EDA tool associated with said cell placement EDA tool and configured to route interconnects in buffer zones separating said clusters.

2. The system as recited in claim 1 wherein said logical circuit representation contains data defining a location of at least one of said clusters.

3. The system as recited in claim 1 wherein said logical circuit representation is contained in a netlist.

4. The system as recited in claim 1 wherein at least two of said mixed cell libraries differ from one another in terms of form factor.

5. The system as recited in claim 1 wherein said cell placement EDA tool is further configured to place said cells according to a specified cluster granularity.

6. The system as recited in claim 1 wherein said cell placement EDA tool is configured to place said cells in accordance with a plurality of technology files associated with said mixed cell libraries.

7. The system as recited in claim 1 wherein said buffer zones contain boundary terminations.

8. A method of circuit design and implementation using mixed cell libraries, comprising:
    transforming a logical circuit representation into a physical circuit representation by placing cells from mixed cell libraries into clusters corresponding to said mixed cell libraries; and
    routing interconnects in buffer zones separating said clusters;
    wherein said transforming and said routing are performed by a computer.

9. The method as recited in claim 8 wherein said logical circuit representation contains data defining a location of at least one of said clusters.

10. The method as recited in claim 8 wherein said logical circuit representation is contained in a netlist.

11. The method as recited in claim 8 wherein at least two of said mixed cell libraries differ from one another in terms of form factor.

12. The method as recited in claim 8 wherein said placing comprises placing said cells according to a specified cluster granularity.

13. The method as recited in claim 8 wherein said placing comprises placing said cells in accordance with a plurality of technology files associated with said mixed cell libraries.

14. The method as recited in claim 8 wherein said buffer zones contain boundary terminations.

15. A non-transitory computer-readable storage medium containing program instructions for designing and implementing a circuit using mixed cell libraries, execution of said program instructions by one or more processors of a computer system causing said one or more processors to:
    transform a logical circuit representation into a physical circuit representation by placing cells from mixed cell libraries into clusters corresponding to said mixed cell libraries; and
    route interconnects in buffer zones separating said clusters.

16. The medium as recited in claim 15 wherein said logical circuit representation contains data defining a location of at least one of said clusters.

17. The medium as recited in claim 15 wherein said logical circuit representation is contained in a netlist.

18. The medium as recited in claim 15 wherein at least two of said mixed cell libraries differ from one another in terms of form factor.

19. The medium as recited in claim 15 wherein said cell placement EDA tool is further configured to place said cells according to a specified cluster granularity.

20. The medium as recited in claim 15 wherein said cell placement EDA tool is configured to place said cells in accordance with a plurality of technology files associated with said mixed cell libraries.

* * * * *